(12) United States Patent
Guard

(10) Patent No.: US 9,071,249 B2
(45) Date of Patent: Jun. 30, 2015

(54) CORROSION RESISTANT TOUCH SENSOR

(75) Inventor: David Brent Guard, Southampton (GB)

(73) Assignee: Atmel Corporation, San Jose, CA (US)

( * ) Notice: Subject to any disclaimer, the term of this patent is extended or adjusted under 35 U.S.C. 154(b) by 687 days.

(21) Appl. No.: 13/348,274

(22) Filed: Jan. 11, 2012

(65) Prior Publication Data
US 2013/0176070 A1 Jul. 11, 2013

(51) Int. Cl.
*H01H 1/10* (2006.01)
*G06F 3/045* (2006.01)
*H03K 17/96* (2006.01)
*G06F 3/044* (2006.01)

(52) U.S. Cl.
CPC ............ *H03K 17/9622* (2013.01); *G06F 3/045* (2013.01); *G06F 3/044* (2013.01); *H03K 2217/96031* (2013.01); *H03K 2217/960755* (2013.01)

(58) Field of Classification Search
USPC ......... 200/512, 513, 514, 600, 262, 263, 268, 200/278, 292, 256; 345/174, 156, 173, 345/175–178, 165, 205, 206; 439/520; 178/18.03, 18.01, 18.05, 18.06
See application file for complete search history.

(56) References Cited

U.S. PATENT DOCUMENTS

| 6,587,345 | B2 * | 7/2003 | Chu et al. | 361/719 |
|---|---|---|---|---|
| 7,432,584 | B2 * | 10/2008 | Goh et al. | 257/666 |
| 7,663,607 | B2 | 2/2010 | Hotelling | |
| 7,875,814 | B2 | 1/2011 | Chen | |
| 7,920,129 | B2 | 4/2011 | Hotelling | |
| 8,031,094 | B2 | 10/2011 | Hotelling | |
| 8,031,174 | B2 | 10/2011 | Hamblin | |
| 8,040,326 | B2 | 10/2011 | Hotelling | |
| 8,049,732 | B2 | 11/2011 | Hotelling | |
| 8,179,381 | B2 | 5/2012 | Frey | |
| 8,491,761 | B2 * | 7/2013 | Borregaard | 204/196.37 |
| 2008/0122081 | A1 * | 5/2008 | Kim et al. | 257/737 |
| 2009/0087629 | A1 * | 4/2009 | Everaerts et al. | 428/203 |
| 2009/0315854 | A1 | 12/2009 | Matsuo | |
| 2011/0254804 | A1 * | 10/2011 | Kuo et al. | 345/174 |
| 2011/0298750 | A1 * | 12/2011 | Wang et al. | 345/174 |
| 2011/0304582 | A1 * | 12/2011 | Ho et al. | 345/174 |
| 2012/0242588 | A1 | 9/2012 | Myers | |
| 2012/0242592 | A1 | 9/2012 | Rothkopf | |
| 2012/0243151 | A1 | 9/2012 | Lynch | |
| 2012/0243719 | A1 | 9/2012 | Franklin | |
| 2013/0076612 | A1 | 3/2013 | Myers | |

FOREIGN PATENT DOCUMENTS

WO WO 2012/129247 9/2012

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

* cited by examiner

*Primary Examiner* — Abdullah Riyami
*Assistant Examiner* — Harshad Patel
(74) *Attorney, Agent, or Firm* — Baker Botts LLP

(57) ABSTRACT

In one embodiment, a touch sensor includes a substrate. A plurality of conductive elements are formed on the substrate. A plurality of sacrificial conductive members overlay portions of the plurality of conductive elements. The sacrificial conductive members function as sacrificial anodes for the conductive elements.

17 Claims, 3 Drawing Sheets

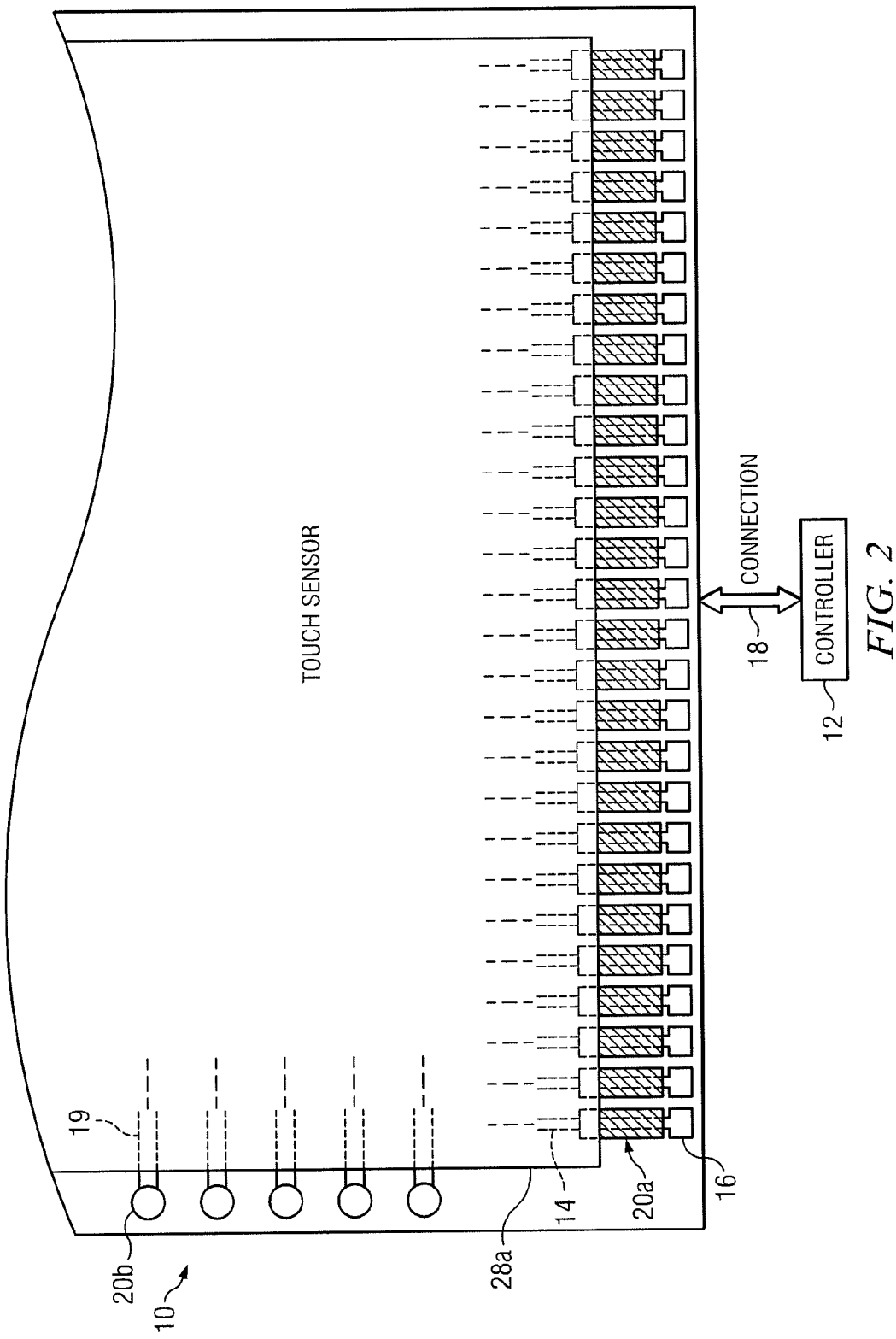

ial conductive members on conductive elements of the touch
CORROSION RESISTANT TOUCH SENSOR

TECHNICAL FIELD

This disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

BRIEF DESCRIPTION OF THE DRAWINGS

FIG. 2 illustrates the touch sensor and touch-sensor controller of FIG. 1 with example sacrificial conductive members overlaying segments of tracks and lines of the touch sensor.

DESCRIPTION OF EXAMPLE EMBODIMENTS

Figure 1:
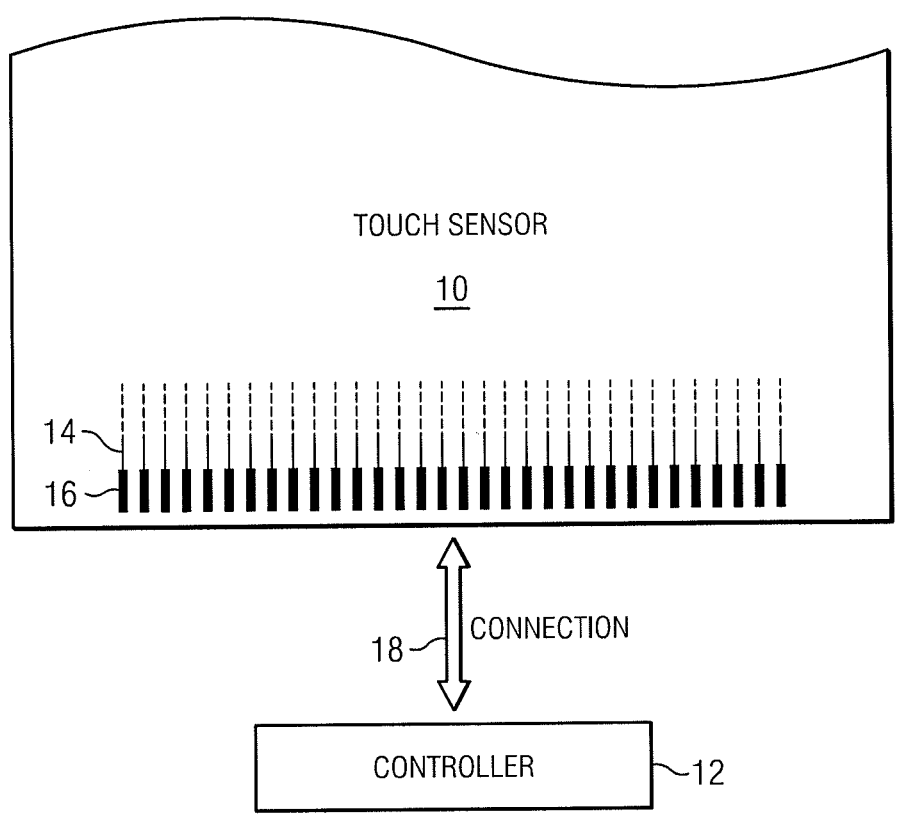
FIG. 1 illustrates an example touch sensor with an example touch-sensor controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, thin line other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 0.5 to 5 µm and a width of approximately 1 to 10 µm. As another example, one or more portions of the conductive material may be silver or silver-based and similarly have a thickness of approximately 0.5 to 5 µm and a width of approximately 1 to 10 µm. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 µm or less. As another example, the conductive material of tracks 14 may be silver or silver-based and have a width of approximately 100 µm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Particular embodiments of the present disclosure may provide sacrificial conductive members that overlay conductive elements of a touch sensor. The sacrificial conductive members may be formed on any suitable conductive elements of a touch sensor, such as drive electrodes, sense electrodes, drive lines, sense lines, ground lines, tracks, connection pads, or other conductive elements that may be exposed to corrosive substances at any time during manufacturing of the touch sensor or thereafter. The sacrificial conductive members guard against rusting or other corrosion of the conductive elements of the touch sensor, thus protecting the touch sensor, particularly during manufacturing, and generally prolonging the life of the touch sensor.

Figure 3A:
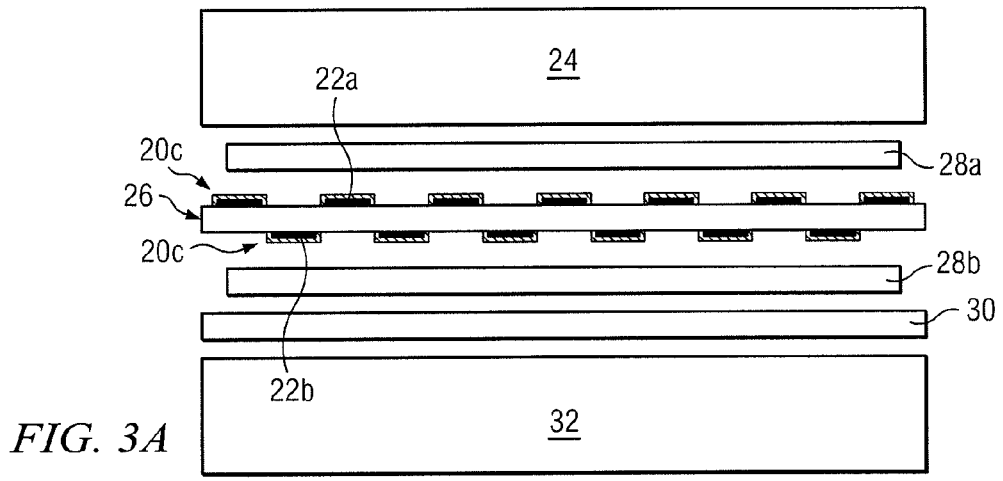
FIGS. 3A and 3B illustrate an example stack of the touch sensor of FIG. 1 with example sacrificial conductive members overlaying electrodes of the touch sensor.
Figure 3B:
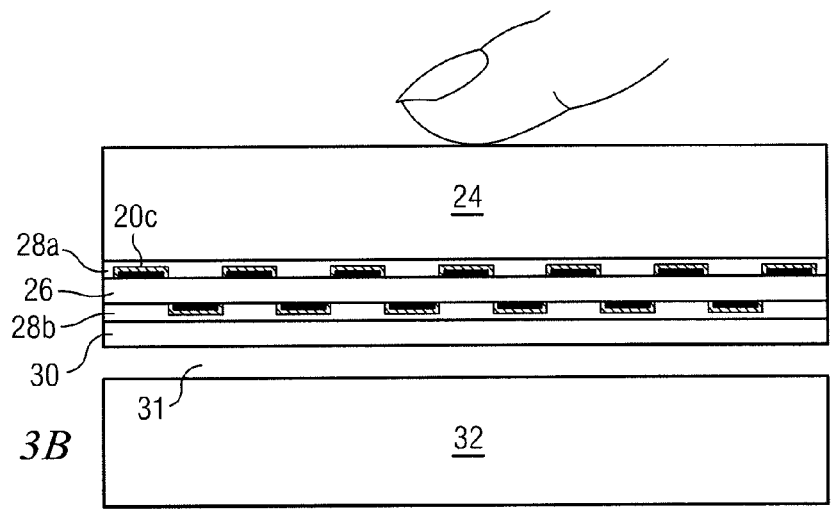

FIG. 2 illustrates touch sensor 10 and touch-sensor controller 12 with example sacrificial conductive members 20 overlaying segments of tracks 14 and lines 19 (e.g., a drive line comprising drive electrodes or a sense line comprising sense electrodes), one or more of which may be coupled to a corresponding track 14 of touch sensor 10. A sacrificial conductive member 20 may be formed on a conductive element formed on a substrate of touch sensor 10. A conductive element may be any suitable element formed on a substrate of touch sensor 10 that carries electrical current and facilitates the detection of touches. For example, conductive elements may include tracks 14, connection pads 16, or lines 19, electrodes 22 formed on substrate 26 (as depicted in FIGS. 3A and 3B), or ground lines of touch sensor 10.

In particular embodiments, when a sacrificial conductive member 20 is formed on a conductive element of touch sensor 10, the sacrificial conductive member completely covers the outside surface of the conductive element. Thus, in various embodiments, the conductive element only has contact with other conductive elements (e.g., an electrode may contact a conductive segment of an interconnect but generally does not contact another electrode), the sacrificial conductive member 20, or substrate 26. Accordingly, the conductive element is not directly exposed to air, moisture, or other substances that may cause corrosion of the conductive element. In other embodiments, the sacrificial conductive member may cover any suitable portion of the outside surface of the conductive element. For example, sacrificial conductive member 20b may be placed adjacent to or on top of a portion of a corresponding conductive element (e.g., line 19) as long as the sacrificial conductive member maintains electrical contact with the corresponding conductive element.

A sacrificial conductive member 20 is formed from a sacrificial conductive material. The sacrificial conductive material may comprise any suitable type of material. In particular embodiments, the sacrificial conductive material includes a metal or a metal alloy. For example, the sacrificial conductive material may include zinc, magnesium, aluminum, nickel, copper, or an alloy including one or more of these metals. In particular embodiments, the sacrificial conductive material has a high level of conductivity, such as approximately $1.0 \times 10^6$ Siemens per meter (S/m) or higher.

In particular embodiments, the sacrificial conductive material includes at least one type of material (such as a particular chemical element) that is not included in the conductive element. As an example, the sacrificial conductive material may be zinc or a zinc based material and the conductive element may be made of copper or a copper based material. Accordingly, the sacrificial conductive member and the conductive element it protects may have different electrical or chemical properties. As an example, in particular embodiments, the sacrificial conductive material has a corrosion resistance that is lower than the corrosion resistance of the conductive element. A material with a corrosion resistance that is lower than the corrosion resistance of another material may appear later in a galvanic series that includes both materials or it may have a nobility that is less than the nobility of the other material. Such embodiments allow the sacrificial conductive member to act as a sacrificial anode and cathodically protect the conductive element if the conductive element is exposed to air, water, or other material that can cause corrosion of the conductive element. When two electrically connected metals are subjected to a corrosive substance, one of the metals may function as a sacrificial anode and undergo galvanic corrosion while the other metal acts as a cathode and is protected from corrosion by the sacrificial anode. In particular embodiments, even if only a portion of a conductive element is covered by a sacrificial conductive member 20, the sacrificial conductive member 20 will corrode before the conductive element does, thus protecting and prolonging the life of the conductive element.

Sacrificial conductive members 20a may function as sacrificial anodes for tracks 14 and connection pads 16. In the embodiment depicted, sacrificial conductive members 20a overlay segments of tracks 14 that are disposed between connection pads 16 and an edge of a layer of adhesive 28a. The layer of adhesive 28a may be placed over a portion of a substrate and various conductive elements formed thereon (an example of which is depicted in FIGS. 3a and 3b). Accordingly, the layer of adhesive 28a may protect some of the conductive elements formed on the substrate. However, other conductive elements (e.g. tracks 14, connection pads 16, or lines 19) may be outside of the area over which the adhesive layer 28a is placed and thus face exposure to corrosive substances such as water. Thus, in some embodiments, sacrificial conductive members 20 are coupled to the conductive elements to provide protection against corrosion.

As depicted, sacrificial conductive members 20a extend slightly past the lower edge of adhesive layer 28a (thus a portion of the adhesive layer 28a rests on top of the sacrificial conductive members 20a). In other embodiments, sacrificial conductive members 20a may extend to or near (but not past) the edge of adhesive layer 28a. In the embodiment depicted, sacrificial conductive members 20a do not overlay connection pads 16, such that electrical coupling between the connection pads 16 and controller 12 is facilitated. Even in such embodiments, sacrificial conductive members 20a are able to cathodically protect connection pads 16. In other embodiments, conductive members 20a overlay all or a portion of connection pads 16.

In the embodiment depicted, a plurality of sacrificial conductive members 20b are placed at the edge of a plurality of drive lines 19. Sacrificial conductive members 20b may overlay portions of lines 19. For example, sacrificial conductive members 20b may be placed on top of lines 19 or adjacent to lines 19. Sacrificial conductive members 20b could overlay ground lines of touch sensor 10 in a similar fashion.

FIGS. 3A and 3B illustrate an example stack of touch sensor 10 with example sacrificial conductive members 20c overlaying electrodes 22 of the touch sensor. In addition to the sacrificial conductive members 20c and electrodes 22, the stack depicted in FIGS. 3A and 3B includes a cover panel 24, a substrate 26, layers of adhesive 28, and a dielectric layer 30. In the embodiment depicted, the stack may overlay and be attached to display panel 32 with an air gap 31 placed between dielectric layer 30 and display panel 32.

As described earlier, a stack may be formed in various different ways. Sacrificial conductive members 20 may be formed on or adjacent to conductive elements and help protect the conductive elements on one or more substrates of the stack, regardless of the particular configuration of the stack. In the embodiment depicted, a layer of adhesive 28a is used to attach cover panel 24 to substrate 26. In yet other embodiments, cover panel 24 may be molded to substrate 26. In the embodiment depicted, drive electrodes 22a are formed on a top surface of substrate 26 and sense electrodes 22b are formed on a bottom surface of substrate 26. In the embodiment depicted, substrate 26 is laminated to a dielectric layer 30 (e.g. glass or PET) via adhesive layer 28b and then mounted onto display panel 32. In other embodiments, substrate 26 may be coupled to display panel 32 using other suitable means. Display panel 32 may be a liquid crystal display (LCD), light emitting diode (LED) display, or other suitable electronic display.

As discussed above, adhesive layers 28 (once applied) may provide some protection against corrosion to the conductive elements formed on the substrate 26. However, in many situations, there may be a delay between the manufacturing of the substrate 26 and conductive elements formed thereon and the application of adhesive layers 28. For example, cover panel 24, dielectric layer 30, or display panel 32 may be attached to substrate 26 at a location that is different from the manufacturing site of the substrate 26. Moreover, in particular embodiments, air gaps may exist between substrate 26 and cover panel 24 or display panel 32. Accordingly, the conductive elements may be exposed to air, moisture, or other substances that could cause corrosion of the conductive elements before or after they are integrated with other components to form touch sensor 10. In particular embodiments, the sacrificial conductive members 20 are formed immediately or soon after the conductive elements are formed on the one or more substrates 26 of the touch sensor 10 in order to protect of the conductive elements from corrosion that could occur before the substrate and conductive elements are integrated with the rest of touch sensor 10.

Sacrificial conductive members 20 may be formed on conductive elements in any suitable manner. In particular embodiments, a sacrificial conductive material may be applied as a coating over an entire surface (or a portion thereof) of substrate 26 and conductive elements formed thereon. Since such an application may result in unwanted electrical connectivity between conductive elements, excessive portions of the sacrificial conductive material may then be removed to form the sacrificial conductive members 20. Any suitable method of removal may be used. In particular embodiments, a laser, etching, or photolithography technique is used to eliminate unwanted portions of the sacrificial conductive material.

Other embodiments may eliminate or mitigate the need to remove the sacrificial material after it is applied to the conductive elements and substrate. For example, the sacrificial conductive material may be applied after the application of a mask to the substrate 26 to ensure proper placement of the sacrificial conductive material only at desired (e.g. un-masked) locations on the substrate or conductive elements. As another example, the sacrificial conductive material may be applied (e.g. printed) directly to the desired locations on substrate 26 without using a mask. In particular embodiments, the sacrificial conductive material is applied in a pattern that is substantially similar to a pattern of the conductive elements on substrate 26. As an example, the same mask may be used to apply the sacrificial conductive members and conductive elements to substrate 26.

Any suitable method can be used to apply the sacrificial conductive material to the conductive elements or surface of substrate 26. In particular embodiments, blocks or disks (or other suitable shape) of sacrificial conductive material are placed against particular conductive elements and the cover panel 24 is laminated to the substrate. The laminated cover panel 24 or adhesive layer 28a may provide pressure against the blocks or disks, resulting in electrical contact between the blocks or disks and the underlying conductive elements formed on substrate 26. As an example, sacrificial conductive members 20b are disk-shaped and could be applied to lines 19 using this method. In some embodiments that utilize such a method, the layer of adhesive 28a may have one or more cutouts for the blocks or disks such that the blocks or disks may fit into these cutouts when the adhesive layer 28a is placed over the substrate 26 and the blocks or disks placed thereon. In another embodiment, the sacrificial conductive material could be a strip included in a roll or tape with a single-sided adhesive. The non-adhesive side of the strip may be placed on top of one or more conductive elements and pressure applied to maintain electrical contact between the strip and the one or more conductive elements. In other embodiments, a sputter deposition technique is used to apply the sacrificial conductive material. In other embodiments, the sacrificial conductive material is screen printed onto the conductive elements and substrate 26. In yet other embodiments, the sacrificial conductive material is heated to a liquid or semi-liquid form. The substrate 26 (and conductive elements) or a portion thereof may then be dipped into the sacrificial conductive material or a coat of the sacrificial conductive material may otherwise be applied to (e.g. brushed onto) the substrate 26.

Figure 4:
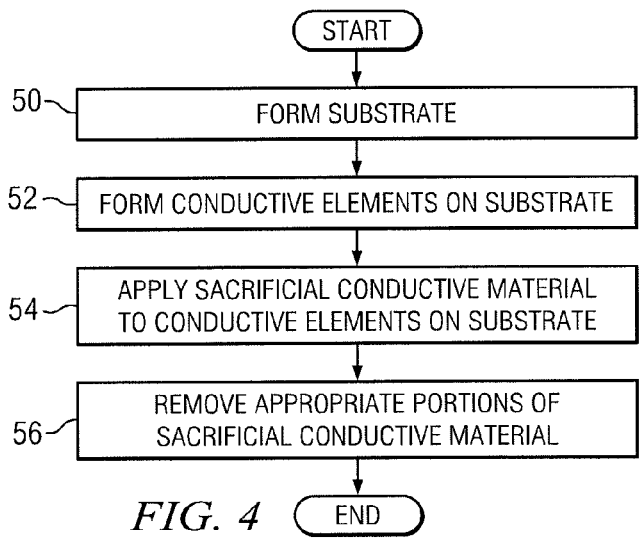
FIG. 4 illustrates an example method for forming sacrificial conductive members on conductive elements of the touch sensor of FIG. 1.

FIG. 4 illustrates an example method for forming sacrificial conductive members 20 over conductive elements of a touch sensor. The method begins as substrate 26 is formed at step 50. Substrate 26 may be formed in any suitable manner and, as discussed earlier, may comprise PET or other insulating material. At step 52, conductive elements are formed on substrate 26. The conductive elements may be formed on any suitable surface of one or more substrates 26. As an example, conductive elements may be formed on a top surface of substrate 26, a top surface and a bottom surface of substrate 26, or on surfaces of two distinct substrates 26. Any suitable conductive element may be formed. For example, the conductive elements may include tracks 14, connection pads 16, drive electrodes 22a, sense electrodes 22b, drive lines, sense lines, or ground lines. The conductive elements may be made of any suitable material, such as FLM. Thus, conductive elements may be made of copper, silver, another metal, or a material based on one or more of these.

At step 54, sacrificial conductive material is applied to the conductive elements. The sacrificial conductive material may be applied in any suitable manner. In particular embodiments, the sacrificial conductive material is applied directly to the conductive elements or portions of the substrate 26 that are adjacent to the conductive elements. In other embodiments, the sacrificial conductive material is applied across entire portions of substrate 26 and conductive elements formed thereon. The sacrificial conductive material may be applied to any suitable surface or conductive elements of one or more substrates 26. As an example, sacrificial conductive material may be formed on a top surface of substrate 26, a top surface and a bottom surface of substrate 26, on surfaces of two distinct substrates 26, or on any conductive element formed on any of these surfaces. At optional step 56, unwanted portions of sacrificial conductive material are removed. Any suitable means may be used to remove the excessive sacrificial conductive material, such as a laser, photolithography, or etching. The method results in a plurality of sacrificial conductive members 20 formed on a plurality of corresponding conductive elements.

Particular embodiments may repeat the steps of the method of FIG. 4, where appropriate. Moreover, although this disclosure describes and illustrates particular steps of the method of FIG. 4 as occurring in a particular order, this disclosure contemplates any suitable steps of the method of FIG. 4 occurring in any suitable order. Furthermore, although this disclosure describes and illustrates particular components, devices, or systems carrying out particular steps of the method of FIG. 4, this disclosure contemplates any suitable combination of any suitable components, devices, or systems carrying out any suitable steps of the method of FIG. 4.

Particular embodiments of the present disclosure may provide one or more or none of the following technical advantages. In particular embodiments, sacrificial conductive members formed on conductive elements of a touch sensor may protect the conductive elements from corroding. Particular embodiments, may prolong the life of the conductive elements of the touch sensor and lead to increase touch sensor performance.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:
1. A touch sensor comprising:
   a substrate;
   a plurality of conductive elements formed on the substrate; and a plurality of sacrificial conductive members, each sacrificial conductive member of at least a subset of the plurality of sacrificial conductive members overlaying at least a portion of one or more conductive elements of the plurality of conductive elements, each sacrificial conductive member of the subset functioning as a sacrificial anode for at least one of the plurality of conductive elements, wherein the plurality of conductive elements include a plurality of tracks that couple a plurality of connection pads to a plurality of electrodes of the touch sensor; and the plurality of sacrificial conductive members overlay a plurality of first segments of the plurality of tracks, each first segment of a track disposed between a connection pad and an edge of an adhesive layer applied over the substrate and a second segment of the track.

2. The touch sensor of claim 1, each sacrificial conductive member of the subset having a corrosion resistance that is lower than a corrosion resistance of the at least one conductive element for which the sacrificial conductive member serves as a sacrificial anode.

3. The touch sensor of claim 1, each sacrificial conductive member of the subset formed of zinc or a zinc based material and the plurality of conductive elements formed of a plurality of fine lines of a metal other than zinc.

4. The touch sensor of claim 1, each sacrificial conductive member of the subset formed of zinc or a zinc based material and the plurality of conductive elements formed of copper or a copper based material.

5. The touch sensor of claim 1, at least one of the plurality of conductive elements comprising a drive electrode or a sense electrode of the touch sensor that is at least partially overlaid by a corresponding sacrificial conductive member.

6. The touch sensor of claim 1, at least one of the plurality of conductive elements comprising a portion of a track of the touch sensor that is at least partially overlaid by a corresponding sacrificial conductive member.

7. The touch sensor of claim 1, at least one of the plurality of conductive elements comprising a connection pad of a plurality of connection pads of the touch sensor, the connection pad overlaid by a corresponding sacrificial conductive member, each connection pad configured to couple one or more drive lines, sense lines, or ground lines of the touch sensor to a touch-sensor controller comprising one or more computer-readable storage media embodying logic operable when executed to control the touch sensor.

8. The touch sensor of claim 1, wherein the plurality of connection pads are not overlaid by sacrificial conductive material.

9. The touch sensor of claim 1, further comprising a layer of optically clear adhesive formed over at least one of the plurality of conductive elements and at least one of the plurality of sacrificial conductive members.

10. The touch sensor of claim 1, wherein the plurality of sacrificial conductive members are formed by:
applying a layer of a sacrificial conductive material over the plurality of conductive elements formed on the substrate and at least a portion of a surface of the substrate; and
removing particular portions of the layer of sacrificial conductive material.

11. A device comprising:
a touch sensor comprising:
a substantially transparent substrate;
a plurality of conductive elements formed on the substantially transparent substrate, the conductive elements comprising fine lines of metal;
a plurality of sacrificial conductive members, each sacrificial conductive member of at least a subset of the plurality of sacrificial conductive members overlaying at least a portion of one or more conductive elements of the plurality of conductive elements, each sacrificial conductive member of the subset functioning as a sacrificial anode for at least one of the plurality of conductive elements;
a touch-sensor controller comprising one or more computer-readable storage media embodying logic that when executed is operable to control the touch sensor; and
an electronic display overlaid by at least a portion of the touch sensor; wherein
the plurality of conductive elements include a plurality of tracks that couple a plurality of connection pads to a plurality of electrodes of the touch sensor; and
the plurality of sacrificial conductive members overlay a plurality of first segments of the plurality of tracks, each first segment of a track disposed between a connection pad and an edge of an adhesive layer applied over the substrate and a second segment of the track.

12. The device of claim 11, each sacrificial conductive member of the subset having a corrosion resistance that is lower than a corrosion resistance of the at least one conductive element for which the sacrificial conductive member serves as the sacrificial anode.

13. The device of claim 11, each sacrificial conductive member of the subset formed of zinc or a zinc based material.

14. The device of claim 11, at least one of the plurality of conductive elements comprising a connection pad of a plurality of connection pads of the touch sensor, the connection pad overlaid by a corresponding sacrificial conductive member, each connection pad configured to couple one or more drive lines, sense lines, or ground lines of the touch sensor to the touch-sensor controller comprising one or more computer-readable storage media embodying logic operable when executed to control the touch sensor.

15. The device of claim 11, wherein the plurality of connection pads are not overlaid by sacrificial conductive material.

16. The device of claim 11, wherein the plurality of sacrificial conductive members are formed by:
applying a layer of a sacrificial conductive material over the plurality of conductive elements formed on the substantially transparent substrate and at least a portion of a surface of the substantially transparent substrate; and
removing particular portions of the layer of sacrificial conductive material.

17. A touch sensor comprising:
a substrate;
a plurality of conductive elements formed on the substrate;
a plurality of sacrificial conductive members, each sacrificial conductive member of at least a subset of the plurality of sacrificial conductive members overlaying at least a portion of one or more conductive elements of the plurality of conductive elements, each sacrificial conductive member of the subset functioning as a sacrificial anode for at least one of the plurality of conductive elements; and
the plurality of sacrificial conductive members comprising sacrificial material placed at the end of a plurality of drive or sense lines of the touch sensor, each drive line coupled to a plurality of drive electrodes, each sense line coupled to a plurality of sense electrodes.

* * * * *